(12) United States Patent
Wu et al.

(10) Patent No.: US 11,846,998 B2
(45) Date of Patent: Dec. 19, 2023

(54) FOLDING MODULE AND FOLDABLE ELECTRONIC DEVICE

(71) Applicant: HUAWEI TECHNOLOGIES CO., LTD., Guangdong (CN)

(72) Inventors: Weifeng Wu, Shenzhen (CN); Tao Huang, Dongguan (CN); Li Liao, Dongguan (CN); Qiang Zhan, Shanghai (CN); Haiqiang Tian, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/363,078

(22) Filed: Jun. 30, 2021

(65) Prior Publication Data

US 2022/0004232 A1  Jan. 6, 2022

(30) Foreign Application Priority Data

Jul. 1, 2020  (CN) .......................... 202010619631.7

(51) Int. Cl.
*G06F 1/16* (2006.01)
*H05K 5/02* (2006.01)

(52) U.S. Cl.
CPC .......... *G06F 1/1681* (2013.01); *G06F 1/1652* (2013.01); *H05K 5/0226* (2013.01)

(58) Field of Classification Search
CPC .... G06F 1/1681; G06F 1/1652; G06F 1/1641; H05K 5/0226; F16C 11/045; F16C 11/12
See application file for complete search history.

(56) References Cited

U.S. PATENT DOCUMENTS

| | | | |
|---|---|---|---|
| 9,021,657 B2 * | 5/2015 | Park ...................... | G06F 1/1616 16/354 |
| 9,348,450 B1 | 5/2016 | Kim | |
| 9,677,308 B1 * | 6/2017 | Chen ..................... | G06F 1/1681 |

(Continued)

FOREIGN PATENT DOCUMENTS

| CN | 1681380 A | 10/2005 |
|---|---|---|
| CN | 101107451 A | 1/2008 |

(Continued)

OTHER PUBLICATIONS

Office Action for Chinese Application No. 202010059260.1 dated Sep. 3, 2021, 7 pages.

(Continued)

*Primary Examiner* — Anthony M Haughton
*Assistant Examiner* — Theron S Milliser (57) ABSTRACT

This disclosure relates to a folding module and a foldable electronic device. A first protrusion and a first sliding slot are provided between a drive portion and a first connection member. A second protrusion and a second sliding slot are provided between the drive portion and a second connection member. A first drive spring and a second drive spring press against the drive portion. In a process in which the first support member folds or unfolds relative to the second support member, folding or unfolding can be implemented provided that the first support member and the second support member rotate by a relatively small angle, so that a speed of folding or unfolding of the first support member relative to the second support member is increased.

14 Claims, 5 Drawing Sheets

(56) References Cited

U.S. PATENT DOCUMENTS

| | | | |
|---|---|---|---|
| 10,231,347 B2* | 3/2019 | Seo | E05D 11/082 |
| 10,469,635 B1 | 11/2019 | Carlson et al. | |
| 10,487,550 B2 | 11/2019 | Chu | |
| 10,845,850 B1* | 11/2020 | Kang | G06F 1/1616 |
| 11,231,754 B2* | 1/2022 | Kang | G06F 1/1652 |
| 11,467,633 B2* | 10/2022 | Liao | H04M 1/0216 |
| 2007/0129609 A1 | 6/2007 | Kawasaki | |
| 2014/0217875 A1* | 8/2014 | Park | G06F 1/1681 |
| | | | 16/354 |
| 2015/0233162 A1 | 8/2015 | Lee et al. | |
| 2016/0116944 A1 | 4/2016 | Lee et al. | |
| 2017/0142240 A1 | 5/2017 | Xu | |
| 2017/0365197 A1 | 12/2017 | Kim et al. | |
| 2018/0024589 A1 | 1/2018 | Nakamura et al. | |
| 2018/0049329 A1* | 2/2018 | Seo | G06F 1/1652 |
| 2018/0324964 A1 | 11/2018 | Yoo et al. | |
| 2019/0163241 A1* | 5/2019 | Moon | G06F 1/1605 |
| 2019/0166703 A1 | 5/2019 | Kim et al. | |
| 2019/0196543 A1 | 6/2019 | Mizoguchi et al. | |
| 2019/0207141 A1 | 7/2019 | Kim et al. | |
| 2019/0286195 A1 | 9/2019 | Lin et al. | |
| 2019/0339742 A1 | 11/2019 | Jia | |
| 2019/0390703 A1 | 12/2019 | Hsu | |
| 2020/0097051 A1 | 3/2020 | Liu | |
| 2020/0267851 A1 | 8/2020 | Hou et al. | |
| 2020/0348732 A1* | 11/2020 | Kang | G06F 1/1616 |
| 2021/0041921 A1* | 2/2021 | Kang | G06F 1/1681 |
| 2021/0181808 A1* | 6/2021 | Liao | G06F 1/1652 |
| 2021/0267077 A1* | 8/2021 | Zhang | H05K 5/0226 |
| 2021/0373612 A1* | 12/2021 | Hwang | F16C 11/04 |
| 2022/0011828 A1* | 1/2022 | Zhan | G06F 1/1616 |
| 2022/0104370 A1 | 3/2022 | Wu et al. | |
| 2022/0113770 A1* | 4/2022 | Kang | G06F 1/1681 |
| 2022/0137676 A1* | 5/2022 | Tian | G06F 1/1652 |
| | | | 361/679.27 |
| 2022/0217859 A1* | 7/2022 | Lee | H05K 5/0017 |
| 2022/0303371 A1* | 9/2022 | Liao | F16C 11/04 |
| 2022/0377919 A1* | 11/2022 | Zhang | G06F 1/1681 |

FOREIGN PATENT DOCUMENTS

| | | |
|---|---|---|
| CN | 101840247 A | 9/2010 |
| CN | 103167071 A | 6/2013 |
| CN | 104836865 A | 8/2015 |
| CN | 105096752 A | 11/2015 |
| CN | 105491193 A | 4/2016 |
| CN | 205750631 U | 11/2016 |
| CN | 205881905 U | 1/2017 |
| CN | 106601130 A | 4/2017 |
| CN | 107632661 A | 1/2018 |
| CN | 207010739 U | 2/2018 |
| CN | 207115888 U | 3/2018 |
| CN | 108173995 A | 6/2018 |
| CN | 108665812 A | 10/2018 |
| CN | 108712535 A | 10/2018 |
| CN | 109032251 A | 12/2018 |
| CN | 109118964 A | 1/2019 |
| CN | 109257460 A | 1/2019 |
| CN | 208421695 U | 1/2019 |
| CN | 208596323 U | 3/2019 |
| CN | 208622359 U | 3/2019 |
| CN | 109658826 A | 4/2019 |
| CN | 109686267 A | 4/2019 |
| CN | 208689844 U | 4/2019 |
| CN | 109830185 A | 5/2019 |
| CN | 208922657 U | 5/2019 |
| CN | 109859630 A | 6/2019 |
| CN | 109979328 A | 7/2019 |
| CN | 110007715 A | 7/2019 |
| CN | 110010001 A | 7/2019 |
| CN | 110010008 A | 7/2019 |
| CN | 110022386 A | 7/2019 |
| CN | 110058444 A | 7/2019 |
| CN | 110061039 A | 7/2019 |
| CN | 209164358 U | 7/2019 |
| CN | 110166591 A | 8/2019 |
| CN | 110189638 A | 8/2019 |
| CN | 110265438 A | 9/2019 |
| CN | 209358590 U | 9/2019 |
| CN | 209375705 U | 9/2019 |
| CN | 209414382 U | 9/2019 |
| CN | 209430596 U | 9/2019 |
| CN | 209545628 U | 10/2019 |
| CN | 110445913 A | 11/2019 |
| CN | 209593488 U | 11/2019 |
| CN | 110552953 A | 12/2019 |
| CN | 110557481 A | 12/2019 |
| CN | 110580854 A | 12/2019 |
| CN | 209724948 U | 12/2019 |
| CN | 209731301 U | 12/2019 |
| CN | 209860956 U | 12/2019 |
| CN | 110671423 A | 1/2020 |
| CN | 110853510 A | 2/2020 |
| CN | 110985524 A | 4/2020 |
| CN | 110992833 A | 4/2020 |
| CN | 111327739 A | 6/2020 |
| CN | 210799707 U | 6/2020 |
| CN | 111615277 A | 9/2020 |
| CN | 111653202 A | 9/2020 |
| CN | 111677747 A | 9/2020 |
| CN | 113053238 A | 6/2021 |
| JP | 2018112836 A | 7/2018 |
| JP | 6453413 B1 | 1/2019 |
| KR | 101487189 B1 | 1/2015 |
| KR | 20160089164 A | 7/2016 |
| KR | 20160144299 A | 12/2016 |
| KR | 20190062107 A | 6/2019 |
| KR | 102007426 B1 | 8/2019 |
| KR | 102152040 B1 | 9/2020 |
| RU | 2596469 C2 | 9/2016 |
| RU | 2683290 C2 | 3/2019 |
| WO | 2015126068 A1 | 8/2015 |
| WO | 2017160680 A1 | 9/2017 |
| WO | 2018070778 A1 | 4/2018 |
| WO | 2018082338 A1 | 5/2018 |
| WO | 2019149238 A1 | 8/2019 |
| WO | 2019151839 A1 | 8/2019 |
| WO | 2019223009 A1 | 11/2019 |
| WO | 2019227296 A1 | 12/2019 |
| WO | 2020057032 A1 | 3/2020 |

OTHER PUBLICATIONS

PCT Search Report for PCT/CN2020/135961 dated Mar. 11, 2021, 9 pages.
PCT Search Report for PCT/CN2020/140445 dated Mar. 17, 2021, 11 pages.
Chinese Search Report for Application No. ZL202020343479X, dated Jan. 19, 2022, 250 pages.
Chinese Office Action for Application No. 202110921357.3, dated Mar. 17, 2022, 7 pages.
Office Action dated Nov. 18, 2022 for Indian Application No. 202217036823, 7 pages.
European Search Report for EP Application No. 20904492.4 dated Dec. 22, 2022, 9 pages.
Office Action dated Feb. 1, 2023 for Chinese Application No. 202080085591, 7 pages.
Federal Service for Intellectual Property Decision to Grant Russian Application No. 2022120356 dated Feb. 1, 2023, 32 pages (with translation).
Office Action for Chinese Application No. 202211376412 dated Mar. 31, 2023, 9 pages.
Notice of Allowance for U.S. Appl. No. 17/514,596 dated Apr. 4, 2023, 63 pages.
Chinese Published Patent Document for CN 115695607 dated May 5, 2023, 24 pages.
Office Action for Chinese Application No. 202211380744.1 dated May 15, 2023, 7 pages.
Korean Intellectual Property Office Notice to Submit a Response for Application No. 10-2022-7025243 dated Jul. 3, 2023, 17 pages.

(56) References Cited

OTHER PUBLICATIONS

Office Action for Chinese Application No. 202211049467.6 dated Jul. 17, 2023, 9 pages.
Office Action for Indian Application No. 202237037955 dated Oct. 16, 2023, 5 pages.
Office Action dated Oct. 24, 2023 for Japanese Application No. 2022-539094, 8 pages (with translation).

* cited by examiner

FOLDING MODULE AND FOLDABLE ELECTRONIC DEVICE

CROSS-REFERENCE TO RELATED DISCLOSURES

This application claims priority to Chinese Patent Application No. 202010619631.7, filed on Jul. 1, 2020, the entire contents of which is hereby incorporated by reference in its entirety.

TECHNICAL FIELD

Embodiments of this disclosure relate to the field of electronic device technologies, and in particular, to a folding module and a foldable electronic device.

BACKGROUND

With gradual development of folding screen technologies, foldable electronic devices emerge. A foldable electronic device generally includes a first support member, a second support member, and a folding screen. The folding screen covers the first support member and the second support member, and the first support member may fold or unfold relative to the second support member. The first support member is connected to the second support member by using a folding module. The folding module includes a first rotating shaft and a second rotating shaft, and the first support member is driven to fold or unfold relative to the second support member by using a first drive spring disposed on the first rotating shaft and a second drive spring disposed on the second rotating shaft. The first support member and the second support member rotate independently, so that the first support member unfolds or folds relative to the second support member at a relatively low speed.

SUMMARY

In view of this, embodiments of this disclosure provide a folding module and a foldable electronic device, to resolve a technical problem that a first support member unfolds or folds relative to a second support member at a relatively low speed because the first support member and the second support member rotate independently.

The embodiments of this disclosure provide a folding module, including a first connection member, a second connection member, a drive portion, a first rotating shaft, and a second rotating shaft. A first shaft hole is provided in the first connection member. A first through hole is provided in the drive portion. The first rotating shaft is disposed in the first shaft hole and the first through hole. A first sliding slot and a first protrusion that match each other are provided between the drive portion and the first connection member. A first drive spring is sleeved over the first rotating shaft. The first drive spring is configured to press against the drive portion toward the first connection member. The second connection member and the first connection member are located on a same side of the drive portion. The second connection member is in a transmission connection (e.g., so that the first connection member drives the second connection member to rotate when the first connection member rotates) to the first connection member. A second shaft hole is provided in the second connection member. A second through hole is provided in the drive portion. The second rotating shaft is disposed in the second shaft hole and the second through hole. A second sliding slot and a second protrusion that match each other are provided between the drive portion and the second connection member. A second drive spring is sleeved over the second rotating shaft. The second drive spring is configured to press against the drive portion toward the second connection member.

In the folding module provided in the embodiments of this disclosure, the first connection member is in a transmission connection to the second connection member, so that in a process in which the first support member folds or unfolds relative to the second support member, the first support member and the second support member simultaneously rotate toward a direction of folding or unfolding. Folding or unfolding can be implemented provided that the first support member and the second support member rotate by a relatively small angle, so that a speed of folding or unfolding of the first support member relative to the second support member is increased.

In the foregoing folding module, the folding module further includes at least one intermediate shaft and a drive gear disposed on a side of the drive portion facing toward the first connection member and the second connection member. The at least one intermediate shaft is disposed between the first rotating shaft and the second rotating shaft. At least one third through hole is provided in the drive portion. Each intermediate shaft is disposed in a third through hole. Through this setting, the drive portion may be fixed by using the intermediate shaft. A first toothed structure is disposed on the first connection member. A second toothed structure is disposed on the second connection member. A quantity of intermediate shafts and a quantity of drive gears are the same, and are both even numbers. A third shaft hole is provided in the drive gear. Each intermediate shaft is disposed in the third shaft hole on the drive gear. Two adjacent drive gears are engaged with each other. The drive gear close to the first toothed structure is engaged with the first toothed structure. The drive gear close to the second toothed structure is engaged with the second toothed structure. Through this setting, a transmission connection between the first toothed structure and the second toothed structure may be implemented by using each drive gear, so that the first connection member and the second connection member simultaneously rotate, and the first support member and the second support member may quickly fold together or unfold.

In the foregoing folding module, a third drive spring is sleeved over the intermediate shaft. The third drive spring presses against the drive portion, and is configured to press against the drive portion toward the first connection member and the second connection member. Through this setting, the third drive spring presses against the drive portion toward the first connection member and the second connection member. Compared with a manner in which only the first drive spring and the second drive spring are disposed, the third drive spring, the first drive spring, and the second drive spring jointly press against the drive portion, to increase a drive force that drives the first connection member and the second connection member to rotate when the first protrusion slides into the first sliding slot and the second protrusion slides into the second sliding slot, thereby increasing power that drives the first support member to rotate relative to the second support member, and making the first support member capable of completely unfolding or folding relative to the second support member.

In the foregoing folding module, a third protrusion and a third sliding slot that match each other are provided between each drive gear and the drive portion.

Through this setting, the drive portion drives the first connection member and the second connection member to rotate, so that when folding or unfolding is performed between the first support member and the second support member, the drive portion further drives each drive gear to rotate, to further drive the first connection member and the second connection member to rotate. In addition, in a process in which the first support member rotates relative to the second support member, a friction force between the drive portion and each drive gear may further increase a damping force of rotation of the first support member relative to the second support member. In addition, when the first support member and the second support member completely unfold or completely fold together, each third protrusion slides into the corresponding third sliding slot. In this case, the first support member and the second support member may further be prevented from rotating, to make the first support member and the second support member maintain a state of completely unfolding or completely folding together.

In the foregoing folding module, a length of each intermediate shaft is less than a length of the first rotating shaft and a length of the second rotating shaft, so that the first rotating shaft and the second rotating shaft on a side of the drive portion that is away from the first connection member and the second connection member enclose a mounting space. Through this setting, the mounting space may provide space for mounting of a fastening member such as a screw and other devices, to improve space utilization.

In the foregoing folding module, the folding module further includes a first stopping portion. The first stopping portion is connected to the first rotating shaft and the second rotating shaft. The first stopping portion presses against a side surface of the first connection member and the second connection member that is away from the drive portion.

Through this setting, the first connection member may be prevented from detaching from an end of the first rotating shaft that is away from the first drive spring, and at the same time, the second connection member may also be prevented from detaching from an end of the second rotating shaft that is away from the second drive spring.

In the foregoing folding module, the first stopping portion includes a first clamp spring, a second clamp spring, a first press block, and a second press block. A fourth through hole is provided in the first press block. A fifth through hole is provided in the second press block. The first rotating shaft is disposed in the fourth through hole. The second rotating shaft is disposed in the fifth through hole. The first press block is located between the first connection member and the first clamp spring. The first clamp spring is clamped in a first annular groove on the first rotating shaft. The second press block is located between the second connection member and the second clamp spring. The second clamp spring is clamped in a second annular groove on the second rotating shaft.

Through this setting, the first clamp spring may be detached from the first rotating shaft, and the second clamp spring may be detached from the second rotating shaft, to further implement detachment of the first stopping portion, thereby facilitating mounting and detachment of the first connection member and the second connection member.

In the foregoing folding module, the first clamp spring and the second clamp spring are of an integral structure. Through this setting, a quantity of parts of the first stopping portion is reduced, to facilitate mounting and detachment of the first stopping portion. In addition, fixation between the first rotating shaft and the second rotating shaft may further be implemented by using the first clamp spring and the second clamp spring.

In the foregoing folding module, the first press block and the second press block are of an integral structure. Through this setting, in a process in which the first connection member and the second connection member rotate, the first press block and the second press block may be prevented from rotating. In addition, fixation between the first rotating shaft and the second rotating shaft may further be implemented by using the first press block and the second press block.

In the foregoing folding module, a fourth protrusion and a fourth sliding slot that match each other are provided between the first connection member and the first press block, and the fourth protrusion is disposed in the fourth sliding slot in a sliding manner; and a fifth protrusion and a fifth sliding slot that match each other are provided between the second connection member and the second press block, and the fifth protrusion is disposed in the fifth sliding slot in a sliding manner.

Through this setting, when the drive portion drives the first connection member and the second connection member to rotate, the fourth protrusion and the fourth sliding slot between the first connection member and the first press block further drive the first connection member to rotate, and the fifth protrusion and the fifth sliding slot between the second connection member and the second press block further drive the second connection member to rotate.

In the foregoing folding module, the folding module further includes a second stopping portion. The second stopping portion is connected to the first rotating shaft and the second rotating shaft. The second stopping portion is configured to press against an end of the first drive spring and the second drive spring that is away from the drive portion.

Through this setting, the second stopping portion may prevent the first drive spring and the second drive spring from detaching.

In the foregoing folding module, the second stopping portion includes a first stopping ring and a second stopping ring. The first stopping ring is connected to the first rotating shaft, and the second stopping ring is connected to the second rotating shaft.

In the foregoing folding module, the first stopping spring and the second stopping spring are of an integral structure. Through this setting, a quantity of parts of the folding module may be reduced, to facilitate detachment and mounting of the folding module. In addition, fixation of the first rotating shaft and the second rotating shaft may further be implemented.

The embodiments of this disclosure further provide a foldable electronic device, including a first support member, a second support member, and the foregoing folding module. The first support member and the second support member are connected to the folding module.

In the foldable electronic device provided in the embodiments of this disclosure, a first through hole and a second through hole are provided in a drive portion of the folding module. A first shaft hole is provided in a first connection member. A first rotating shaft is disposed in the first through hole and the first shaft hole. A second shaft hole is provided in a second connection member. A second rotating shaft is disposed in the second through hole and the second shaft hole. A first protrusion and a first sliding slot are provided between the drive portion and the first connection member. A second protrusion and a second sliding slot are provided between the drive portion and the second connection member. A first drive spring is sleeved over the first rotating shaft, and a second drive spring is sleeved over the second rotating shaft. The first drive spring and the second drive spring press against the drive portion toward the first connection member and the second connection member. The first connection member is in a transmission connection to the second connection member, so that in a process in which the first support member folds or unfolds relative to the second support member, the first support member and the second support member simultaneously rotate toward a direction of folding or unfolding. Folding or unfolding can be implemented provided that the first support member and the second support member rotate by a relatively small angle, so that a speed of folding or unfolding of the first support member relative to the second support member is increased.

BRIEF DESCRIPTION OF DRAWINGS

To describe the technical solutions in the embodiments of this disclosure or in the prior art more clearly, the following briefly introduces the accompanying drawings used in describing the embodiments or the related art. The accompanying drawings in the following description show some embodiments of this disclosure, and a person of ordinary skill in the art may still derive other drawings from these accompanying drawings.

DESCRIPTION OF REFERENCE SIGNS

1: First support member;
2: Second support member;
3: Folding module;
4: Mounting space;
10: First connection member;
101: First protrusion;
102: First toothed structure;
103: Fourth sliding slot;
104: First drive spring;
20: Second connection member;
201: Second protrusion;
202: Second toothed structure;
203: Fifth sliding slot;
204: Second drive spring;
30: Drive portion;
301: First sliding slot;
302: Second sliding slot;
303: First through hole;
304: Second through hole;
305: Third through hole;
306: Third sliding slot;
40: First rotating shaft;
401: First annular groove;
402: Convex portion;
50: Second rotating shaft;
501: Second annular groove;
60: First stopping portion;
601: First clamp spring;
602: Second clamp spring;
603: First press block;
604: Second press block;
605: Fourth protrusion;
606: Fifth protrusion;
607: Third press block;
608: Sixth protrusion;
609: Third clamp spring;
70: Intermediate shaft;
701: Third annular groove;
702: Third drive spring;
80: Second stopping portion;
801: First stopping ring;
802: Second stopping ring;
803: Third stopping ring;
90: Drive gear;
901: Third protrusion; and
902: Sixth sliding slot.

DESCRIPTION OF EMBODIMENTS

To make the objectives, technical solutions, and advantages of the embodiments of this disclosure clearer, the following describes the technical solutions in the embodiments of this disclosure with reference to the accompanying drawings in the embodiments of this disclosure. The described embodiments are a part (rather than all) of the embodiments of this disclosure. All other embodiments obtained by a person of ordinary skill in the art based on the embodiments of this disclosure shall fall within the protection scope of this disclosure.

In the related art, a folding module includes a first rotating shaft, a second rotating shaft, a drive portion, a first drive spring, and a second drive spring. A first support member is in a transmission connection to the first rotating shaft. The first drive spring is sleeved over the first rotating shaft. A second support member is in a transmission connection to the second rotating shaft, and the second drive spring is sleeved over the second rotating shaft. A first hole and a second hole are provided in the drive portion. The first rotating shaft is disposed in the first hole, and the second rotating shaft is disposed in the second hole. A first drive ring is further sleeved over the first rotating shaft, and the first drive ring is in a transmission connection to the first rotating shaft. The drive portion is located between the first drive ring and the first drive spring. A first sliding slot is provided on the first drive ring. A first protrusion is disposed on the drive portion. The first drive spring is configured to press the drive portion on the first drive ring, so that the first protrusion is embedded into the first sliding slot. A second drive ring is sleeved over the second rotating shaft, and the second drive ring is in a transmission connection to the second rotating shaft. The second drive ring is sleeved over the second rotating shaft. The drive portion is located between the second drive ring and the second drive spring. A second sliding slot is provided on the second drive ring. A second protrusion is disposed on the drive portion. The second drive spring is configured to press the drive portion on the second drive ring, so that the second protrusion is embedded into the second sliding slot. In a process in which the first support member folds or unfolds relative to the second support member, the first protrusion gradually slides into the first sliding slot, and the second protrusion gradually slides into the second sliding slot, to implement unfolding or folding of the first support member and the second support member.

However, the first rotating shaft and the second rotating shaft may independently rotate. When the first support member unfolds or folds relative to the second support member, the first support member rotates relative to the second support member by a relatively large angle, or unfolds or folds relative to the second support member at a relatively low speed.

An embodiment of this disclosure provides a foldable electronic device, in which a first support member and a second support member can be enabled, through a transmission connection between the first support member and the second support member, to simultaneously rotate, thereby increasing a speed of folding or unfolding.

Figure 1:
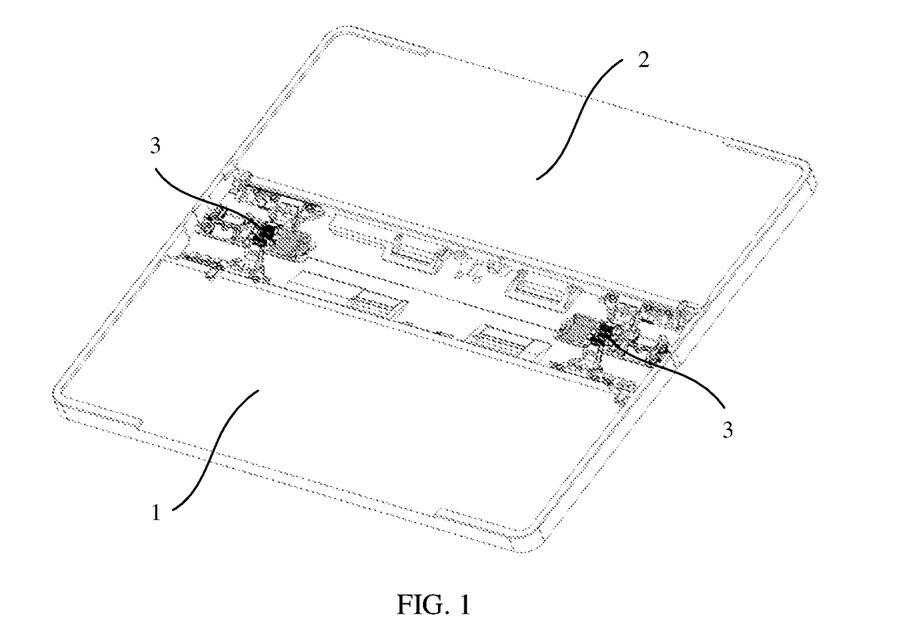
FIG. 1 is an example schematic structural diagram of a foldable electronic device according to an embodiment of this disclosure.
Figure 2:
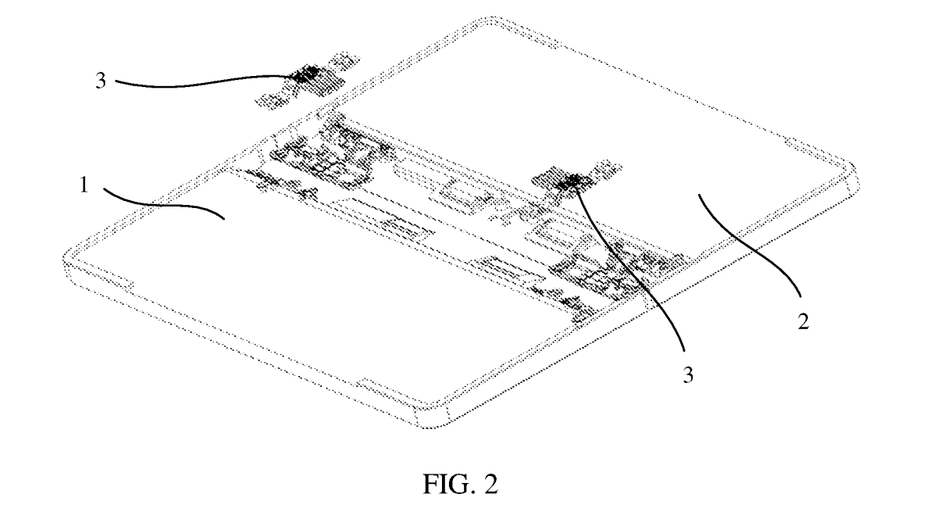
FIG. 2 is an example exploded view of a foldable electronic device according to an embodiment of this disclosure.

The foldable electronic device provided in this embodiment of this disclosure may be a foldable electronic device such as a clamshell phone, a foldable tablet computer, or a notebook computer. Referring to FIG. 1 and FIG. 2, the foldable electronic device includes a first support member 1, a second support member 2, and a folding module 3. The first support member 1 is connected to the second support member 2 by using the folding module 3, so that the folding module 3 enables the first support member 1 to rotate relative to the second support member 2, thereby implementing unfolding or folding of the first support member 1 relative to the second support member 2. For example, the first support member 1 may be connected to the second support member 2 by using one or more folding modules 3. For example, in the embodiment shown in FIG. 1, the first support member 1 may be connected to the second support member 2 by using two folding modules 3.

Further, the foldable electronic device may further include a flexible screen. The flexible screen covers the first support member 1 and the second support member 2. When the first support member 1 unfolds relative to the second support member 2, the flexible screen unfolds with the first support member 1 and the second support member 2. When the first support member 1 folds relative to the second support member 2, the flexible screen folds together with the first support member 1 and the second support member 2.

Figure 3:
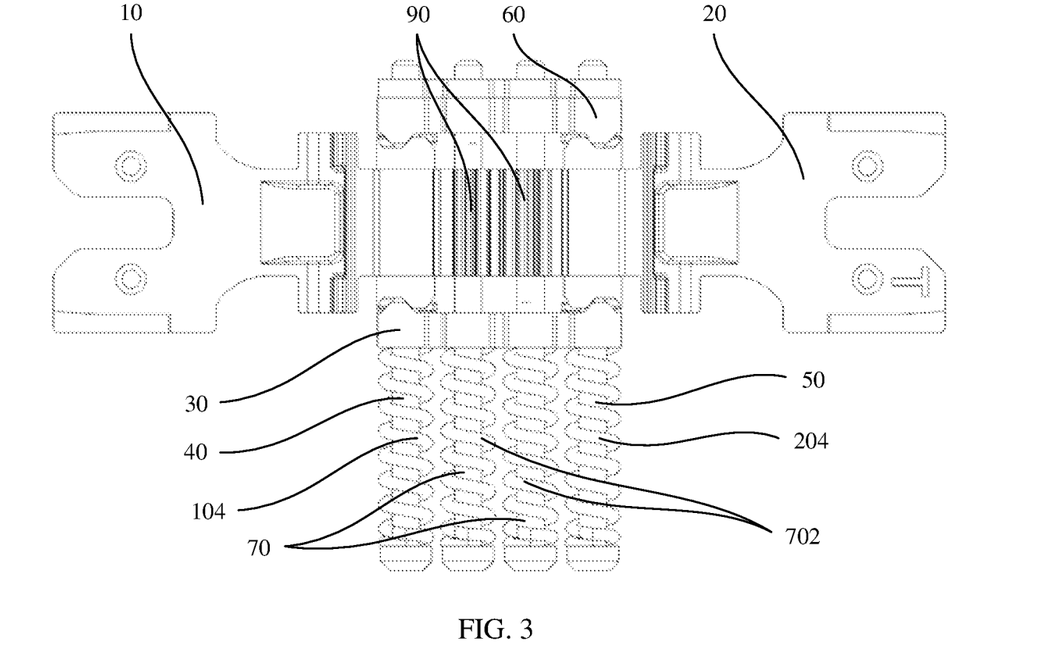
FIG. 3 is an example schematic structural diagram of a folding module according to an embodiment of this disclosure.

Referring to FIG. 3, the folding module 3 includes a first connection member 10 and a second connection member 20. The first connection member 10 is connected to the first support member 1. The second connection member 20 is connected to the second support member 2. In other words, the first support member 1 is connected to the folding module 3 by using the first connection member 10, and the second support member 2 is connected to the folding module 3 by using the second support member 2. For example, a first hinge hole is provided in the first connection member 10, a second hinge hole is provided in the first support member 1, and a first hinged shaft is disposed in the first hinge hole and the second hinge hole, to implement a connection between the first support member 1 and the first connection member 10. Similarly, a third hinge hole is provided in the second connection member 20, a fourth hinge hole is provided in the second support member 2, and a second hinged shaft is disposed in the third hinge hole and the fourth hinge hole, to implement a connection between the second support member 2 and the second connection member 20.

Certainly, in other implementations, the first connection member 10 and the first support member 1 may alternatively be connected in a bolt connection or clamping manner. Similarly, the second connection member 20 and the second support member 2 may alternatively be connected in a bolt connection or clamping manner. A manner of connection between the first connection member 10 and the first support member 1 and a manner of connection between the second connection member 20 and the second support member 2 are not limited in this embodiment.

Referring to FIG. 3 to FIG. 6, the folding module 3 further includes a first rotating shaft 40, a second rotating shaft 50, and a drive portion 30. A first shaft hole is provided in the first connection member 10, a second shaft hole is provided in the second connection member 20, and a first through hole 303 and a second through hole 304 are provided in the drive portion 30. The first rotating shaft 40 is disposed in the first shaft hole and the first through hole 303, and the second rotating shaft 50 is disposed in the second shaft hole and the second through hole 304. The first rotating shaft 40 is disposed parallel to the second rotating shaft 50. The first connection member 10 and the second connection member 20 are located on a same side of the drive portion 30 along a direction parallel to the first rotating shaft 40.

A first drive spring 104 is further sleeved over the first rotating shaft 40. The drive portion 30 is located between the first connection member 10 and the first drive spring 104. The first drive spring 104 presses against the drive portion 30 toward the first connection member 10, so that the drive portion 30 presses against the first connection member 10. A first protrusion 101 and a first sliding slot 301 that match each other are provided between the first connection member 10 and the drive portion 30. The first protrusion 101 is disposed in the first sliding slot 301 in a sliding manner.

For example, the first protrusion 101 may be disposed on a side surface of the first connection member 10 facing toward the drive portion 30, and correspondingly, the first sliding slot 301 is provided on a side surface of the drive portion 30 facing toward the first connection member 10. Alternatively, the first protrusion 101 is disposed on the side surface of the drive portion 30 facing toward the first connection member 10, and correspondingly, the first sliding slot 301 is provided on the side surface of the first connection member 10 facing toward the drive portion 30. In this way, when the first connection member 10 rotates around the first rotating shaft 40 to an extent that the first protrusion 101 is about to slide into the first sliding slot 301, under pressing of the first drive spring 104, the first protrusion 101 automatically slides into the first sliding slot 301, and a thrust generated in this process drives the first connection member 10 to rotate.

Similarly, a second drive spring 204 is sleeved over the second rotating shaft 50. The drive portion 30 is located between the second connection member 20 and the second drive spring 204. In other words, the first drive spring 104 and the second drive spring 204 are both located on a side of the drive portion 30 that is away from the first connection member 10 and the second connection member 20. The second drive spring 204 presses against the drive portion 30 toward the second connection member 20, so that the drive portion 30 presses against the second connection member 20. A second protrusion 201 and a second sliding slot 302 that match each other are provided between the second connection member 20 and the drive portion 30. The second protrusion 201 is disposed in the second sliding slot 302 in a sliding manner.

For example, the second protrusion 201 may be disposed on a side surface of the second connection member 20 facing toward the drive portion 30, and correspondingly, the second sliding slot 302 is provided on a side surface of the drive portion 30 facing toward the second connection member 20. Alternatively, the second protrusion 201 is disposed on the side surface of the drive portion 30 facing toward the second connection member 20, and correspondingly, the second sliding slot 302 is provided on the side surface of the second connection member 20 facing toward the drive portion 30. When the second connection member 20 rotates around the second rotating shaft 50 to an extent that the second protrusion 201 is about to slide into the second sliding slot 302, under pressing of the second drive spring 204, the second protrusion 201 automatically slides into the second sliding slot 302, and a thrust generated in this process drives the second connection member 20 to rotate.

Positions of the first protrusion 101 and the first sliding slot 301 and positions of the second protrusion 201 and the second sliding slot 302 are properly set, so that in a process in which the first connection member 10 rotates relative to the second connection member 20, the first protrusion 101 slides into the first sliding slot 301, and at the same, the second protrusion 201 slides into the second sliding slot 302. When the first support member 1 rotates relative to the second support member 2, and the first support member 1 is about to completely unfold relative to the second support member 2, the first protrusion 101 is about to slide into the first sliding slot 301, and the second protrusion 201 is about to slide into the second sliding slot 302. In this way, the first drive spring 104 and the second drive spring 204 press against the drive portion 30, to drive the first protrusion 101 to automatically slide into the first sliding slot 301, and at the same time, the second protrusion 201 automatically slides into the second sliding slot 302. In this case, the first connection member 10 drives the first support member 1 to rotate, and the second connection member 20 drives the second support member 2 to rotate, thereby implementing automatic unfolding of the first support member 1 and the second support member 2.

In this embodiment, when the first protrusion 101 is about to slide into the first sliding slot 301, and the second protrusion 201 is about to slide into the second sliding slot 302, the first support member 1 and the second support member 2 may be about to fold together. Correspondingly, the first drive spring 104 and the second drive spring 204 press against the drive portion 30, to drive the first protrusion 101 to automatically slide into the first sliding slot 301, and at the same time, the second protrusion 201 automatically slides into the second sliding slot 302. In this case, the first connection member 10 drives the first support member 1 to rotate, and the second connection member 20 drives the second support member 2 to rotate, thereby implementing automatic folding of the first support member 1 and the second support member 2.

Continuing to refer to FIG. 3 to FIG. 6, in the foregoing implementation, there may be a plurality of first protrusions 101 disposed between the first connection member 10 and the drive portion 30. The plurality of first protrusions 101 are disposed at intervals around a central line of the first rotating shaft 40. Correspondingly, a plurality of first sliding slots 301 are provided, and a quantity of the first protrusions 101 is the same as a quantity of the first sliding slots 301. Similarly, there may also be a plurality of second protrusions 201 disposed between the second connection member 20 and the drive portion 30. The plurality of second protrusions 201 are disposed at intervals around a central line of the second rotating shaft 50. Correspondingly, a plurality of second sliding slots 302 are provided, and a quantity of the second protrusions 201 is the same as a quantity of the second sliding slots 302. When the first support member 1 fold or unfolds relative to the second support member 2, each first protrusion 101 is disposed in a first sliding slot 301 in a sliding manner, and at the same time, each second protrusion 201 is disposed in a second sliding slot 302 in a sliding manner.

Further, when the first support member 1 rotates relative to the second support member 2 to an extent that the first support member 1 and the second support member 2 are about to fold together, each first protrusion 101 is about to slide into a first sliding slot 301, and each second protrusion 201 is about to slide into a second sliding slot 302. In this case, the first drive spring 104 and the second drive spring 204 press against the drive portion 30, so that each first protrusion 101 automatically slides into the corresponding first sliding slot 301, and each second protrusion 201 automatically slides into the corresponding second sliding slot 302, thereby implementing automatic folding of the first support member 1 and the second support member 2. In addition, when the first support member 1 rotates relative to the second support member 2 to an extent that the first support member 1 and the second support member 2 are about to completely unfold, each first protrusion 101 is about to slide into a first sliding slot 301, and each second protrusion 201 is about to slide into a second sliding slot 302. In this case, the first drive spring 104 and the second drive spring 204 press against the drive portion 30, so that each first protrusion 101 automatically slides into the corresponding first sliding slot 301, and each second protrusion 201 automatically slides into the corresponding second sliding slot 302, thereby implementing automatic unfolding of the first support member 1 and the second support member 2. In this way, automatic unfolding and automatic folding of the first support member 1 and the second support member 2 can be implemented.

In the foregoing implementation, quantities of the first protrusions 101 and the first sliding slots 301 provided between the first connection member 10 and the drive portion 30 may both be two, three, four, or the like. Quantities of the second protrusions 201 and the second sliding slots 302 provided between the second connection member 20 and the drive portion 30 may be the same as the quantity of the first protrusions 101, so that the second protrusion 201 slides into the second sliding slot 302 when the first protrusion 101 slides into the first sliding slot 301.

In this embodiment, in the process in which the first support member 1 rotates relative to the second support member 2, there is sliding between the drive portion 30 and the first connection member 10 and the second connection member 20. A friction force between the drive portion 30 and the first connection member 10 and the second connection member 20 provides a damping force for rotation of the first support member 1 relative to the second support member 2, thereby improving user experience. In addition, after the first support member 1 and the second support member 2 completely unfold or completely fold together, the first protrusion 101 is disposed in the first sliding slot 301 in a sliding manner, and the second protrusion 201 is disposed in the second sliding slot 302 in a sliding manner, so that the first connection member 10 and the second connection member 20 can be prevented from rotating, thereby making the first support member 1 and the second support member 2 maintain a state of completely unfolding or completely folding.

In this embodiment, the first connection member 10 is in a transmission connection to the second connection member 20, so that the first connection member 10 drives the second connection member 20 to rotate when the first connection member 10 rotates. In this way, the first support member 1 and the second support member 2 can quickly fold together or unfold.

Continuing to refer to FIG. 3 to FIG. 6, for example, a first toothed structure 102 may be disposed on the first connection member 10. Correspondingly, a second toothed structure 202 is disposed on the second connection member 20. The first toothed structure 102 may be directly engaged with the second toothed structure 202, to implement a transmission connection between the first toothed structure 102 and the second toothed structure 202. The first toothed structure 102 may include a first gear disposed on the first connection member 10. Certainly, the first toothed structure 102 may further include a plurality of transmission gears disposed on the first connection member 10. Similarly, the second toothed structure 202 may include a second gear disposed on the second connection member 20. Certainly, the second toothed structure 202 may further include a plurality of transmission gears disposed on the second connection member 20.

Continuing to refer to FIG. 3 to FIG. 6, in this embodiment, the folding module 3 further includes at least one intermediate shaft 70. A central line of the intermediate shaft 70 is parallel to central lines of the first rotating shaft 40 and the second rotating shaft 50, and each intermediate shaft 70 is located between the first rotating shaft 40 and the second rotating shaft 50. Each intermediate shaft 70, the first rotating shaft 40, and the second rotating shaft 50 may be located in a same plane. At least one third through hole 305 is provided in the drive portion 30. Each intermediate shaft 70 is disposed in a third through hole 305, and fixation of the drive portion 30 may be implemented by using the intermediate shaft 70. For example, there may be one or a plurality of intermediate shafts 70. In an implementation in which there are a plurality of intermediate shafts 70, a quantity of the intermediate shafts 70 may be two, four, or the like.

In an implementation in which the first toothed structure 102 is disposed on the first connection member 10, and the second toothed structure 202 is disposed on the second connection member 20, the folding module 3 further includes at least one drive gear 90. The drive gear 90 is located on a side of the drive portion 30 facing toward the first connection member 10 and the second connection member 20. A third shaft hole is provided in the drive gear 90. Each intermediate shaft 70 is disposed in the third shaft hole on the drive gear 90. Two adjacent drive gears 90 are engaged with each other. The drive gear 90 close to the first toothed structure 102 is engaged with the first toothed structure 102. The drive gear 90 close to the second toothed structure 202 is engaged with the second toothed structure 202. Through this setting, a transmission connection between the first toothed structure 102 and the second toothed structure 202 may be implemented by using each drive gear 90, so that the first connection member 10 and the second connection member 20 simultaneously rotate. Compared with a manner in which the first toothed structure 102 is directly engaged with the second toothed structure 202, sizes of the first toothed structure 102 and the second toothed structure 202 may be reduced, to facilitate miniaturization of the folding module 3.

It is worth noting that, to ensure that the first support member 1 and the second support member 2 rotate in opposite directions, so that the first support member 1 and the second support member 2 can quickly fold or unfold, the quantity of the intermediate shafts 70 is an even number. Correspondingly, the drive gear 90 is disposed on each intermediate shaft 70. In other words, a quantity of the drive gears 90 and the quantity of the intermediate shafts 70 are the same and are both even numbers.

Figure 6:
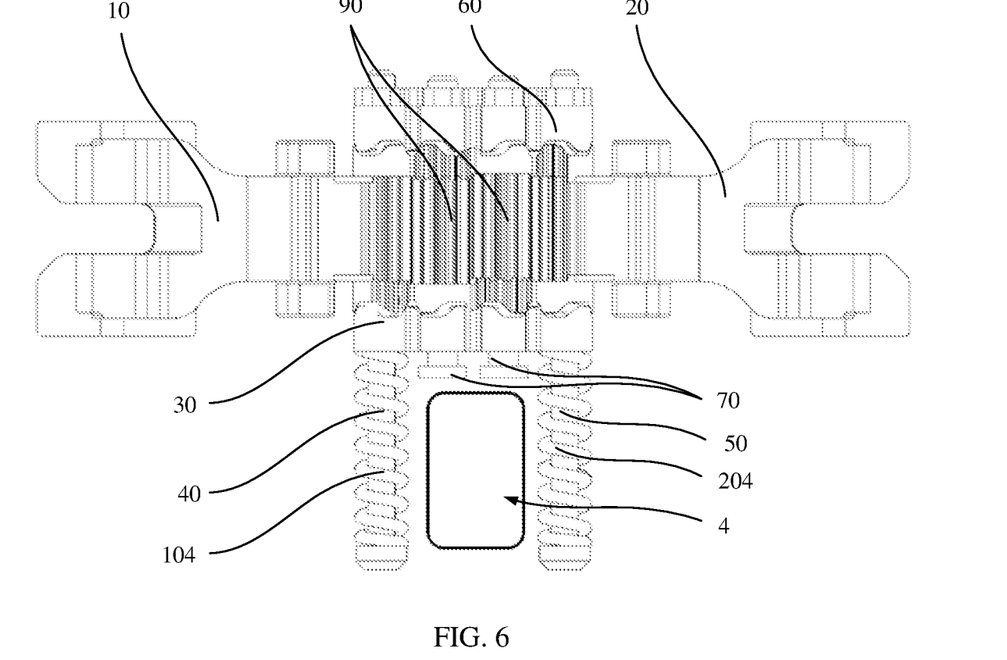
FIG. 6 is an example schematic structural diagram of a folding module according to an embodiment of this disclosure.

Continuing to refer to FIG. 6, in some embodiments, a length of each intermediate shaft 70 is less than a length of the first rotating shaft 40 and a length of the second rotating shaft 50, so that the first rotating shaft 40 and the second rotating shaft 50 on a side of the drive portion 30 that is away from the first connection member 10 and the second connection member 20 enclose a mounting space 4. In other words, an end of each intermediate shaft 70 that is away from the drive portion 30 may be flush with an end of the first rotating shaft 40 and the second rotating shaft 50 that is away from the drive portion 30, so that an end of the intermediate shaft 70 that is close to the drive portion 30, the first rotating shaft 40, and the second rotating shaft 50 enclose the mounting space 4. Through this setting, the mounting space 4 may provide space for mounting of a fastening member such as a screw and other devices, to improve space utilization.

Figure 4:
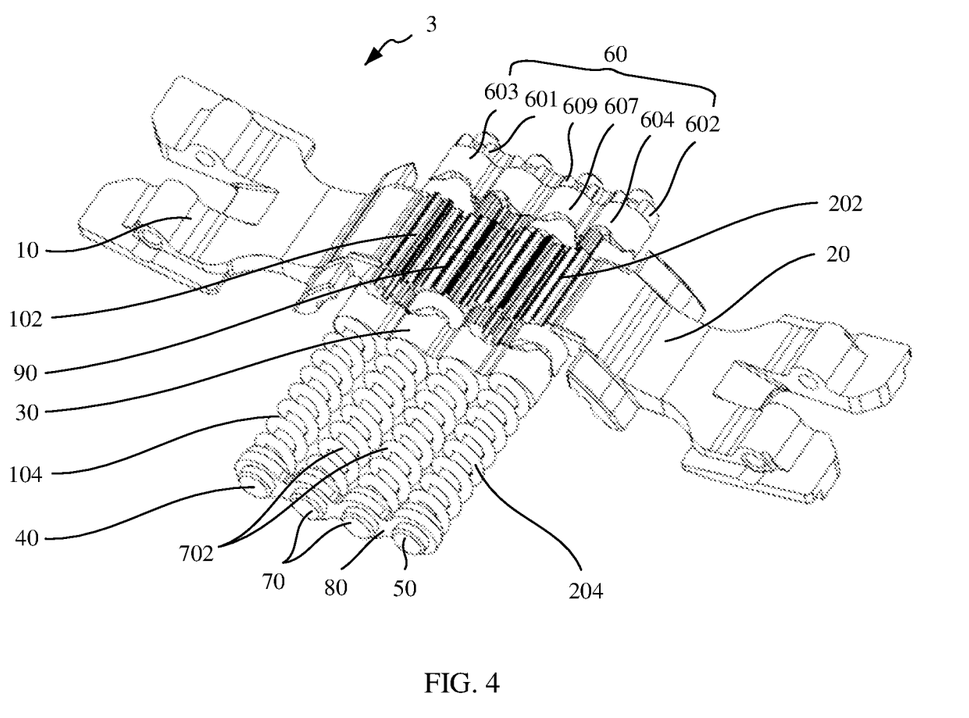
FIG. 4 is an example exploded view of a folding module according to an embodiment of this disclosure.
Figure 5:
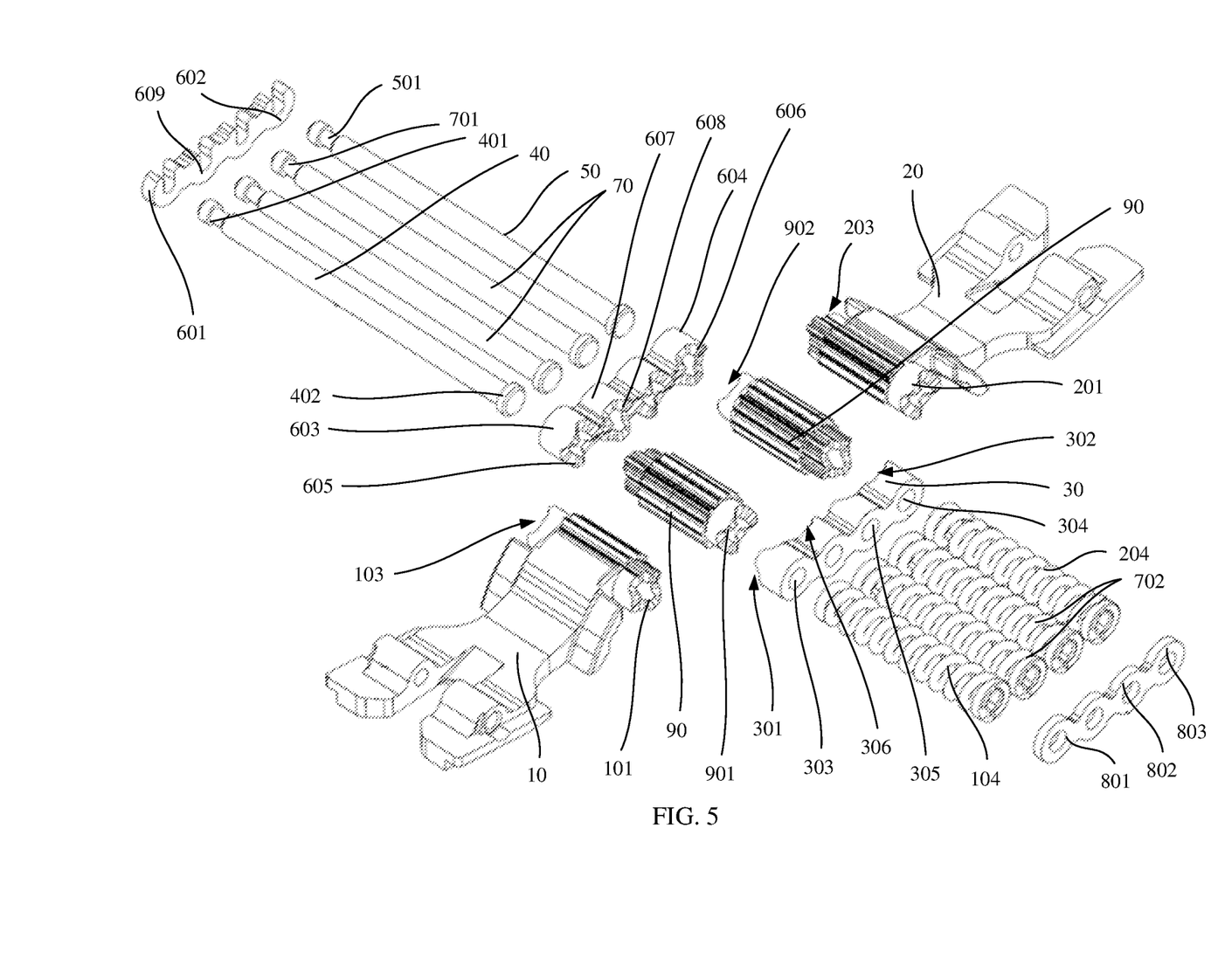
FIG. 5 is an example schematic structural diagram of a folding module according to an embodiment of this disclosure.

In this embodiment, continuing to refer to FIG. 3 to FIG. 5, a third drive spring 702 is sleeved over the intermediate shaft 70. The third drive spring 702 is located on a side of the drive portion 30 that is away from the first connection member 10 and the second connection member 20. The third drive spring 702 presses against the drive portion 30. The third drive spring 702 presses against the drive portion 30 toward the first connection member 10 and the second connection member 20. The third drive spring 702, the first drive spring 104, and the second drive spring 204 simultaneously press against the drive portion 30, to increase a drive force in a process in which the first protrusion 101 slides into the first sliding slot 301, and a drive force in a process in which the second protrusion 201 slides into the second sliding slot 302, thereby increasing a drive force that drives the first connection member 10 and the second connection member 20 to rotate, and also increasing a drive force that drives the first support member 1 and the second support member 2 to fold or unfold, and making the first support member 1 capable of completely unfolding or completely folding relative to the second support member 2.

Further, in the implementation in which there are a plurality of intermediate shafts 70, the third drive spring 702 is disposed on each intermediate shaft 70. Each third drive spring 702, the first drive spring 104, and the second drive spring 204 jointly press against the drive portion 30, to further increase the drive force that drives the first support member 1 and the second support member 2 to fold or unfold.

Continuing to refer to FIG. 4 and FIG. 5, a third protrusion 901 and a third sliding slot 306 that match each other are provided between each drive gear 90 and the drive portion 30. When the first protrusion 101 gradually slides into the first sliding slot 301, and the second protrusion 201 gradually slides into the second sliding slot 302, the third protrusion 901 gradually slides into the third sliding slot 306. Positions of the third protrusion 901 and the third sliding slot 306 between each drive gear 90 and the drive portion 30 are properly set, so that the third protrusions 901 between the drive gears 90 and the drive portion 30 simultaneously slide into the corresponding third sliding slots 306. In a process in which the third protrusion 901 is disposed in the third sliding slots 306 in a sliding manner, the corresponding drive gear 90 is driven to rotate. Drive forces applied to two adjacent drive gears 90 are opposite. In addition, a drive force applied to the drive gear 90 engaged with the first toothed structure 102 is opposite to a drive force applied to the first connection member 10, and a drive force applied to the drive gear 90 engaged with the second toothed structure 202 is opposite to a drive force applied to the second connection member 20.

Through the foregoing setting, the drive portion 30 drives the first connection member 10 and the second connection member 20 to rotate, so that when folding or unfolding is performed between the first support member 1 and the second support member 2, the drive portion 30 further drives each drive gear 90 to rotate, to further drive the first connection member 10 and the second connection member 20 to rotate. In addition, in the process in which the first support member 1 rotates relative to the second support member 2, a friction force between the drive portion 30 and each drive gear 90 may further increase a damping force of rotation of the first support member 1 relative to the second support member 2. In addition, when the first support member 1 and the second support member 2 completely unfold or completely fold together, each third protrusion 901 slides into the corresponding third sliding slot 306. In this case, the first support member 1 and the second support member 2 may further be prevented from rotating, to further make the first support member 1 and the second support member 2 maintain a state of completely unfolding or completely folding together.

In the folding module 3 provided in this embodiment, the first through hole 303 and the second through hole 304 are provided in the drive portion 30. The first shaft hole is provided in the first connection member 10. The first rotating shaft 40 is disposed in the first through hole 303 and the first shaft hole. The second shaft hole is provided in the second connection member 20. The second rotating shaft 50 is disposed in the second through hole 304 and the second shaft hole. The first protrusion 101 and the first sliding slot 301 are provided between the drive portion 30 and the first connection member 10. The second protrusion 201 and the second sliding slot 302 are provided between the drive portion 30 and the second connection member 20. The first drive spring 104 is sleeved over the first rotating shaft 40, and the second drive spring 204 is sleeved over the second rotating shaft 50. The first drive spring 104 and the second drive spring 204 press against the drive portion 30 toward the first connection member 10 and the second connection member 20. The first connection member 10 is in a transmission connection to the second connection member 20, so that in a process in which the first support member 1 folds or unfolds relative to the second support member 2, the first support member 1 and the second support member 2 simultaneously rotate toward a direction of folding or unfolding. Folding or unfolding can be implemented provided that the first support member 1 and the second support member 2 rotate by a relatively small angle, so that a speed of folding or unfolding of the first support member 1 relative to the second support member 2 is increased.

In addition, the third drive spring 702 is disposed on the intermediate shaft 70. The third drive spring 702 presses against the drive portion 30 toward the first connection member 10 and the second connection member 20. Compared with a manner in which only the first drive spring 104 and the second drive spring 204 are disposed, the third drive spring 702, the first drive spring 104, and the second drive spring 204 jointly press against the drive portion 30, to increase a drive force that drives the first connection member 10 and the second connection member 20 to rotate when the first protrusion 101 slides into the first sliding slot 301 and the second protrusion 201 slides into the second sliding slot 302, thereby increasing power that drives the first support member 1 to rotate relative to the second support member 2, and making the first support member 1 capable of completely unfolding or folding relative to the second support member 2.

Continuing to refer to FIG. 3 to FIG. 5, in the foregoing implementation, the folding module 3 further includes a first stopping portion 60. The first stopping portion 60 is connected to the first rotating shaft 40 and the second rotating shaft 50. The first stopping portion 60 presses against a side surface of the first connection member 10 and the second connection member 20 that is away from the drive portion 30. Through this setting, the first connection member 10 may be prevented from detaching from an end of the first rotating shaft 40 that is away from the first drive spring 104, and at the same time, the second connection member 20 may also be prevented from detaching from an end of the second rotating shaft 50 that is away from the second drive spring 204.

For example, the first stopping portion 60 may include a first flange disposed on a side wall of the first rotating shaft 40, and a second flange disposed on a side wall of the second rotating shaft 50. The first flange and the first rotating shaft 40 may be of an integral structure, and similarly, the second flange and the second rotating shaft 50 may be of an integral structure.

In this embodiment, the first stopping portion 60 includes a first clamp spring 601, a second clamp spring 602, a first press block 603, and a second press block 604. A fourth through hole is provided in the first press block 603. A fifth through hole is provided in the second press block 604. The first rotating shaft 40 is disposed in the fourth through hole. The second rotating shaft 50 is disposed in the fifth through hole. The first press block 603 is located between the first connection member 10 and the first clamp spring 601. The first clamp spring 601 is clamped in a first annular groove 401 on the first rotating shaft 40. The second press block 604 is located between the second connection member 20 and the second clamp spring 602. The second clamp spring 602 is clamped in a second annular groove 501 on the second rotating shaft 50. Through this setting, the first clamp spring 601 may be detached from the first rotating shaft 40, and the second clamp spring 602 may be detached from the second rotating shaft 50, to further implement detachment of the first stopping portion 60, thereby facilitating mounting and detachment of the first connection member 10 and the second connection member 20.

For example, the first clamp spring 601 may include a clamp board. A clamping slot is provided on a periphery of the clamp board. The first rotating shaft 40 in the first annular groove 401 is clamped in the clamping slot, to implement a connection between the first clamp spring 601 and the first rotating shaft 40. Further, the first clamp spring 601 may have elasticity, so that the first clamp spring 601 is in interference fit with the first rotating shaft 40 in the first annular groove 401 under an effect of elasticity of the first clamp spring 601, thereby preventing the first clamp spring 601 from detaching from the first rotating shaft 40. A structure of the second clamp spring 602 is approximately similar to that of the first clamp spring 601.

Further, the first clamp spring 601 and the second clamp spring 602 are of an integral structure. Through this setting, a quantity of parts of the first stopping portion 60 is reduced, to facilitate mounting and detachment of the first stopping portion 60. In addition, fixation between the first rotating shaft 40 and the second rotating shaft 50 may further be implemented by using the first clamp spring 601 and the second clamp spring 602.

In this embodiment, the first press block 603 and the second press block 604 may be of an integral structure. Through this setting, in the process in which the first connection member 10 and the second connection member 20 rotate, the first press block 603 and the second press block 604 may be prevented from rotating. In addition, fixation between the first rotating shaft 40 and the second rotating shaft 50 may further be implemented by using the first press block 603 and the second press block 604.

Further, a fourth protrusion 605 and a fourth sliding slot 103 that match each other are provided between the first connection member 10 and the first press block 603, and the fourth protrusion 605 is disposed in the fourth sliding slot 103 in a sliding manner. A fifth protrusion 606 and a fifth sliding slot 203 that match each other are provided between the second connection member 20 and the second press block 604, and the fifth protrusion 606 is disposed in the fifth sliding slot 203 in a sliding manner. Through this setting, when the drive portion 30 drives the first connection member 10 and the second connection member 20 to rotate, the fourth protrusion 605 and the fourth sliding slot 103 between the first connection member 10 and the first press block 603 further drive the first connection member 10 to rotate, and the fifth protrusion 606 and the fifth sliding slot 203 between the second connection member 20 and the second press block 604 further drive the second connection member 20 to rotate.

It is worth noting that, when the first protrusion 101 gradually slides into the first sliding slot 301 and the second protrusion 201 gradually slides into the second sliding slot 302, the fourth protrusion 605 gradually slides into the fourth sliding slot 103 and the fifth protrusion 606 gradually slides into the fifth sliding slot 203. In addition, a direction of a drive force provided by the drive portion 30 for the first connection member 10 is the same as that of a drive force provided by the first press block 603 for the first connection member 10. A direction of a drive force provided by the drive portion 30 for the second connection member 20 is the same as that of a drive force provided by the second press block 604 for the second connection member 20.

For example, the fourth protrusion 605 may be disposed on the first press block 603, and correspondingly, the fourth sliding slot 103 is provided on the first connection member 10. Alternatively, the fourth protrusion 605 is disposed on the first connection member 10, and correspondingly, the fourth sliding slot 103 is provided on the first press block 603. The fifth protrusion 606 may be disposed on the second press block 604, and correspondingly, the fifth sliding slot 203 is provided on the second connection member 20. Alternatively, the fifth protrusion 606 is disposed on the second connection member 20, and correspondingly, the fifth sliding slot 203 is provided on the second press block 604.

Continuing to refer to FIG. 4 and FIG. 5, in an implementation in which the folding module 3 includes drive gears 90, the quantity of the intermediate shafts 70 is an even number, a plurality of third through holes 305 are provided in the drive portion 30, and each intermediate shaft 70 is disposed in a third through hole 305. The quantity of the drive gears 90 is the same as the quantity of the intermediate shafts 70. The third shaft hole is provided in each drive gear 90. Each intermediate shaft 70 is disposed in a third shaft hole. Two adjacent drive gears 90 are engaged with each other. The drive gear 90 close to the first connection member 10 is engaged with the first toothed structure 102 on the first connection member 10. The drive gear 90 close to the second connection member 20 is engaged with the second toothed structure 202 on the second connection member 20. The third protrusion 901 and the third sliding slot 306 are provided between the drive portion 30 and each drive gear 90. Further, the first stopping portion 60 further includes a plurality of third press blocks 607 and a plurality of third clamp springs 609. A sixth through hole is provided in each third press block 607. Each intermediate shaft 70 is disposed in a previous sixth through hole. In addition, each third press block 607 is located between the corresponding drive gear 90 and third clamp spring 609. The third clamp spring 609 is clamped in a third annular groove 701 on the corresponding intermediate shaft 70.

Each third clamp spring 609, the first clamp spring 601, and the second clamp spring 602 may be of an integral structure. Correspondingly, each third press block 607, the first press block 603, and the second press block 604 are of an integral structure.

In the foregoing implementation, a sixth protrusion 608 and a sixth sliding slot 902 that match each other are provided between each third press block 607 and the corresponding drive gear 90. When the third protrusion 901 between the same drive gear 90 and the drive portion 30 slides into the third sliding slot 306, the sixth protrusion 608 between the drive gear 90 and the third press block 607 slides into the sixth sliding slot 902. In addition, a direction of a drive force applied by the third press block 607 for the drive gear 90 is the same as that of a drive force applied by the drive portion 30 for the drive gear 90. In other words, the direction of the force from the drive portion 30 for driving the same drive gear 90 to rotate is the same as that of the force from the third press block 607 for driving the same drive gear 90 to rotate, to drive the drive gear 90 to rotate under a joint effect of the third press block 607 and the drive portion 30.

It is worth noting that, the sixth protrusion 608 may be disposed on the third press block 607, and correspondingly, the sixth sliding slot 902 is provided on the drive gear 90. Alternatively, the sixth protrusion 608 is disposed on the drive gear 90, and correspondingly, the sixth sliding slot 902 is provided on the third press block 607.

Continuing to refer to FIG. 4 and FIG. 5, in this embodiment, the folding module 3 further includes a second stopping portion 80. The second stopping portion 80 is connected to the first rotating shaft 40, the second rotating shaft 50, and each intermediate shaft 70. The second stopping portion 80 is configured to press against an end of the first drive spring 104, the second drive spring 204, and each third drive spring 702 that is away from the drive portion 30. Through this setting, the second stopping portion 80 may prevent the first drive spring 104, the second drive spring 204, and each third drive spring 702 from detaching.

For example, the second stopping portion 80 may include a first annular flange disposed on the first rotating shaft 40, a second annular flange disposed the second rotating shaft 50, and a third annular flange disposed on each intermediate shaft 70

In this embodiment, the second stopping portion 80 includes a first stopping ring 801, a second stopping ring 802, and at least one third stopping ring 803. The first stopping ring 801 is connected to the first rotating shaft 40. The second stopping ring 802 is connected to the second rotating shaft 50. Each third stopping ring 803 is connected to an intermediate shaft 70.

It is worth noting that, to prevent the first stopping ring 801 from detaching from the first rotating shaft 40, a convex portion 402 may be disposed on an end portion of the first rotating shaft 40 that is close to the first drive spring 104.

The convex portion 402 presses against an end of the first stopping ring 801 that is away from the first drive spring 104. Similarly, convex portions 402 are disposed on both an end portion of the second rotating shaft 50 that is close to the second drive spring 204, and an end portion of the intermediate shaft that is close to the third drive spring 702, to prevent the second stopping ring 802 and the third stopping ring 803 from detaching.

Further, the first stopping ring 801, the second stopping ring 802, and the third stopping ring 803 are of an integral structure. Through this setting, a quantity of parts of the folding module 3 may be reduced, to facilitate detachment and mounting of the folding module 3. In addition, fixation of the first rotating shaft 40, the second rotating shaft 50, and each intermediate shaft 70 may further be implemented.

A process of using the foldable electronic device provided in this embodiment, as a non-limiting example, is: a user makes the first support member 1 rotate relative to the second support member 2, to further implement folding or unfolding of the foldable electronic device. When the first support member 1 is about to fold or completely unfold relative to the second support member 2, the first drive spring 104, the second drive spring 204, and each third drive spring 702 jointly press against the drive portion 30 toward the first connection member 10 and the second connection member 20. At the same time, the first connection member 10 presses against the first press block 603, the second connection member 20 presses against the second press block 604, and each drive gear 90 presses against the corresponding third press block 607. Under pressing of the drive portion 30, the first protrusion 101 between the drive portion 30 and the first connection member 10 gradually slides into the first sliding slot 301, and the fourth protrusion 605 between the first connection member 10 and the first press block 603 gradually slides into the fourth sliding slot 103, to further drive the first connection member 10 to rotate. The second protrusion 201 between the drive portion 30 and the second connection member 20 gradually slides into the second sliding slot 302, and the fifth protrusion 606 between the second connection member 20 and the second press block 604 gradually slides into the fifth sliding slot 203, to further drive the second connection member 20 to rotate. At the same time, the third protrusion 901 between the drive portion 30 and each drive gear 90 gradually slides into the third sliding slots, and the sixth protrusion 608 between the drive gear 90 and the third press block 607 gradually slides into the sixth sliding slot 902, to further drive each drive gear 90 to rotate, and each drive gear 90 further drives the first connection member 10 and the second connection member 20 to rotate; until the protrusions slide into the corresponding sliding slots, automatic folding or automatic unfolding between the first support member 1 and the second support member 2 is implemented by using the first connection member 10 and the second connection member 20.

In the description of this disclosure, it should be understood that, an orientation or position relationship indicated by terms "center", "longitudinal", "lateral", "length", "width", "thickness", "up", "down", "front", "rear", "left", "right", "vertical", "horizontal", "top", "bottom", "inner", "outer", "clockwise", "counterclockwise", "axial", "radial", "circumferential", and the like is based on an orientation or position relationship shown in the accompanying drawings. The orientation or position relationship is merely for ease of describing this disclosure and simplifying the description, but does not indicate or imply that the indicated apparatus or element needs to have a specific orientation, be configured, and operate in a specific orientation. Therefore, the orientation or position relationship cannot be construed as a limitation on this disclosure.

It should be noted that the terms "first" and "second" in the description of this disclosure are only used to conveniently describe different components, and shall not be understood as an indication or implication of sequence relationship, relative importance or implicit indication of the number of indicated technical features. Therefore, a feature limited by "first" or "second" may explicitly or implicitly include at least one of the features.

In this disclosure, unless otherwise expressly specified, terms "mount", "connect", "connection", "fix" and the like should be understood broadly. For example, a connection may be a fixed connection, may be a detachable connection, may be integral formation, may be a mechanical connection, or may be an electrical connection or mutual communication; may be a direct connection, may be an indirect connection by using an intermediate medium, or may be internal communication between two elements or an interaction relationship between the two elements, unless otherwise expressly limited. A person of ordinary skill in the art may understand specific meanings of the foregoing terms in this disclosure based on specific situations.

Finally, it should be noted that the foregoing embodiments are merely intended for describing the technical solutions of this disclosure other than limiting this disclosure. Although this disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of this disclosure.

What is claimed is:

1. A folding module, comprising:
a first connection member;
a second connection member;
a drive portion;
a first rotating shaft; and
a second rotating shaft, wherein
a first shaft hole is provided in the first connection member,
a first through hole is provided in the drive portion, the first rotating shaft is disposed in the first shaft hole and the first through hole,
a first sliding slot and a first protrusion that match each other are provided between the drive portion and the first connection member,
a first drive spring is sleeved over the first rotating shaft, the first drive spring is configured to press against the drive portion toward the first connection member,
the second connection member and the first connection member are located on a same side of the drive portion, the second connection member is in a transmission connection to the first connection member,
a second shaft hole is provided in the second connection member,
a second through hole is provided in the drive portion, the second rotating shaft is disposed in the second shaft hole and the second through hole,
a second sliding slot and a second protrusion that match each other are provided between the drive portion and the second connection member, a second drive spring is sleeved over the second rotating shaft, the second drive spring is configured to press against the drive portion toward the second connection member, a first stopping portion, wherein the first stopping portion is connected to the first rotating shaft and the second rotating shaft, and the first stopping portion presses against a side surface of the first connection member and the second connection member that is away from the drive portion, wherein the first stopping portion comprises:

a first clamp spring;

a second clamp spring;

a first press block; and a second press block, wherein a fourth through hole is provided in the first press block, a fifth through hole is provided in the second press block, the first rotating shaft is disposed in the fourth through hole, and the second rotating shaft is disposed in the fifth through hole, the first press block is located between the first connection member and the first clamp spring, and the first clamp spring is clamped in a first annular groove on the first rotating shaft, and the second press block is located between the second connection member and the second clamp spring, and the second clamp spring is clamped in a second annular groove on the second rotating shaft, wherein a fourth protrusion and a fourth sliding slot that match each other are provided between the first connection member and the first press block, and a fifth protrusion and a fifth sliding slot that match each other are provided between the second connection member and the second press block;

wherein when the first protrusion slides into the first sliding slot and the second protrusion slides into the second sliding slot, the fourth protrusion slides into the fourth sliding slot and the fifth protrusion slides into the fifth sliding slot.

2. The folding module according to claim 1, further comprising:

at least one intermediate shaft; and a drive gear disposed on a side of the drive portion facing toward the first connection member and the second connection member, wherein the at least one intermediate shaft is disposed between the first rotating shaft and the second rotating shaft, at least one third through hole is provided in the drive portion, and each intermediate shaft is disposed in a third through hole, a first toothed structure is disposed on the first connection member, and a second toothed structure is disposed on the second connection member, a quantity of intermediate shafts and a quantity of drive gears are the same, and are both even numbers, and a third shaft hole is provided in the drive gear, each intermediate shaft is disposed in the third shaft hole on the drive gear, two adjacent drive gears are engaged with each other, the drive gear close to the first toothed structure is engaged with the first toothed structure, and the drive gear close to the second toothed structure is engaged with the second toothed structure.

3. The folding module according to claim 2, wherein a third drive spring is sleeved over the at least one intermediate shaft, the third drive spring presses against the drive portion, and is configured to press against the drive portion toward the first connection member and the second connection member, and a third protrusion and a third sliding slot that match each other are provided between each drive gear and the drive portion.

4. The folding module according to claim 3, wherein a third protrusion and a third sliding slot that match each other are provided between each drive gear and the drive portion.

5. The folding module according to claim 2, wherein a length of each intermediate shaft is less than a length of the first rotating shaft and a length of the second rotating shaft, so that the first rotating shaft and the second rotating shaft on a side of the drive portion that is away from the first connection member and the second connection member enclose a mounting space.

6. The folding module according to claim 1, further comprising:

a second stopping portion, wherein the second stopping portion is connected to the first rotating shaft and the second rotating shaft, and the second stopping portion is configured to press against an end of the first drive spring and the second drive spring that is away from the drive portion, and wherein the second stopping portion comprises:

a first stopping ring; and a second stopping ring, wherein the first stopping ring is connected to the first rotating shaft, and the second stopping ring is connected to the second rotating shaft.

7. A foldable electronic device, comprising:

a first support member;

a second support member; and a folding module, wherein the folding module comprises:

a first connection member;

a second connection member;

a drive portion;

a first rotating shaft; and a second rotating shaft, wherein a first shaft hole is provided in the first connection member, a first through hole is provided in the drive portion, the first rotating shaft is disposed in the first shaft hole and the first through hole, a first sliding slot and a first protrusion that match each other are provided between the drive portion and the first connection member, a first drive spring is sleeved over the first rotating shaft, the first drive spring is configured to press against the drive portion toward the first connection member, the second connection member and the first connection member are located on a same side of the drive portion, the second connection member is in a transmission connection to the first connection member, a second shaft hole is provided in the second connection member, a second through hole is provided in the drive portion, the second rotating shaft is disposed in the second shaft hole and the second through hole, a second sliding slot and a second protrusion that match each other are provided between the drive portion and the second connection member, a second drive spring is sleeved over the second rotating shaft, the second drive spring is configured to press against the drive portion toward the second connection member, and the first support member and the second support member are connected to the folding module, a first stopping portion, wherein the first stopping portion is connected to the first rotating shaft and the second rotating shaft, and the first stopping portion presses against a side surface of the first connection member and the second connection member that is away from the drive portion, wherein the first stopping portion comprises:

a first clamp spring;

a second clamp spring;

a first press block; and a second press block, wherein a fourth through hole is provided in the first press block, a fifth through hole is provided in the second press block, the first rotating shaft is disposed in the fourth through hole, and the second rotating shaft is disposed in the fifth through hole, the first press block is located between the first connection member and the first clamp spring, and the first clamp spring is clamped in a first annular groove on the first rotating shaft, and the second press block is located between the second connection member and the second clamp spring, and the second clamp spring is clamped in a second annular groove on the second rotating shaft, wherein a fourth protrusion and a fourth sliding slot that match each other are provided between the first connection member and the first press block, and a fifth protrusion and a fifth sliding slot that match each other are provided between the second connection member and the second press block;

wherein when the first protrusion slides into the first sliding slot and the second protrusion slides into the second sliding slot, the fourth protrusion slides into the fourth sliding slot and the fifth protrusion slides into the fifth sliding slot.

8. The foldable electronic device according to claim 7, wherein the folding module further comprises:

at least one intermediate shaft, and a drive gear disposed on a side of the drive portion facing toward the first connection member and the second connection member, wherein the at least one intermediate shaft is disposed between the first rotating shaft and the second rotating shaft, at least one third through hole is provided in the drive portion, and each intermediate shaft is disposed in a third through hole, a first toothed structure is disposed on the first connection member, and a second toothed structure is disposed on the second connection member, a quantity of intermediate shafts and a quantity of drive gears are the same, and are both even numbers, and a third shaft hole is provided in the drive gear, each intermediate shaft is disposed in the third shaft hole on the drive gear, two adjacent drive gears are engaged with each other, the drive gear close to the first toothed structure is engaged with the first toothed structure, and the drive gear close to the second toothed structure is engaged with the second toothed structure.

9. The foldable electronic device according to claim 8, wherein a third drive spring is sleeved over the at least one intermediate shaft, the third drive spring presses against the drive portion, and is configured to press against the drive portion toward the first connection member and the second connection member, and a third protrusion and a third sliding slot that match each other are provided between each drive gear and the drive portion.

10. The foldable electronic device according to claim 8, wherein a length of each intermediate shaft is less than a length of the first rotating shaft and a length of the second rotating shaft, so that the first rotating shaft and the second rotating shaft on a side of the drive portion that is away from the first connection member and the second connection member enclose a mounting space.

11. The foldable electronic device according to claim 7, wherein the folding module further comprises:

a second stopping portion, wherein the second stopping portion is connected to the first rotating shaft and the second rotating shaft, and the second stopping portion is configured to press against an end of the first drive spring and the second drive spring that is away from the drive portion, and wherein the second stopping portion comprises:

a first stopping ring; and a second stopping ring, wherein the first stopping ring is connected to the first rotating shaft, and the second stopping ring is connected to the second rotating shaft.

12. The foldable electronic device according to claim 11, wherein the second stopping portion comprises:

a first stopping ring; and a second stopping ring, wherein the first stopping ring is connected to the first rotating shaft, and the second stopping ring is connected to the second rotating shaft.

13. The folding module according to claim 1, wherein the second connection member and the first connection member are located on the same side of the drive portion along a direction parallel to the first rotating shaft.

14. The folding module according to claim 1, wherein the first connection member is configured to drive a first support member to rotate, and the second connection member is configured to drive a second support member to rotate thereby causing the first support member and the second support member to automatically fold together.

* * * * *

UNITED STATES PATENT AND TRADEMARK OFFICE
CERTIFICATE OF CORRECTION

PATENT NO. : 11,846,998 B2
APPLICATION NO. : 17/363078
DATED : December 19, 2023
INVENTOR(S) : Weifeng Wu et al.

It is certified that error appears in the above-identified patent and that said Letters Patent is hereby corrected as shown below:

On the Title Page

Under U.S. Patent Documents, please add the following references:
US Patent No. 10,036,188 issued 2018-07-31 by HSU-HONG YAO
US Publication No. 20160302314 published 2016-10-13 by YU-DONG BAE
US Publication No. 20190268456 published 2019-08-29 by HYUN MIN PARK Under Other Publications, please add the following references:
Notice of Allowance for U.S. Application No. 17/487,292 dated February 8, 2023, 140 pages Signed and Sealed this
Twentieth Day of February, 2024

Katherine Kelly Vidal
*Director of the United States Patent and Trademark Office*